United States Patent
Huh et al.

(10) Patent No.: US 11,362,162 B2
(45) Date of Patent: Jun. 14, 2022

(54) METHOD OF MANUFACTURING METAL OXIDE FILM AND DISPLAY DEVICE INCLUDING METAL OXIDE FILM

(71) Applicant: Samsung Display Co., Ltd., Yongin-si (KR)

(72) Inventors: Myung Soo Huh, Suwon-si (KR); Dong Kyun Ko, Hwaseong-si (KR); Sung Chui Kim, Seongnam-si (KR); Woo Jin Kim, Hwaseong-si (KR); Cheol Lae Roh, Seongnam-si (KR); Keun Hee Park, Seoul (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 0 days.

(21) Appl. No.: 16/132,031

(22) Filed: Sep. 14, 2018

(65) Prior Publication Data
US 2019/0115409 A1 Apr. 18, 2019

(30) Foreign Application Priority Data
Oct. 13, 2017 (KR) .......................... 10-2017-0133462

(51) Int. Cl.
*H01L 27/32* (2006.01)
*H01L 21/02* (2006.01)
(Continued)

(52) U.S. Cl.
CPC ...... *H01L 27/3265* (2013.01); *H01L 21/0228* (2013.01); *H01L 21/02181* (2013.01);
(Continued)

(58) Field of Classification Search
CPC ............ H01I 21/02181; H01I 21/02186; H01I 21/02189; H01I 21/0228; H01I 21/02252; H01I 21/02274
See application file for complete search history.

(56) References Cited

U.S. PATENT DOCUMENTS

| | | |
|---|---|---|
| 6,204,203 B1 | 3/2001 | Narwankar et al. |
| 6,916,747 B2 | 7/2005 | Wachi et al. |
| (Continued) | | |

FOREIGN PATENT DOCUMENTS

| | | |
|---|---|---|
| CN | 1455441 | 11/2003 |
| CN | 1619819 | 5/2005 |
| (Continued) | | |

OTHER PUBLICATIONS

Aldrich, "Precursors for Atomic Layer Deposition", https://www.sigmaaldrich.com/content/dam/sigma-aldrich/docs/Aldrich/Brochure/1/precursors-atomic-layer-deposition.pdf, May 2, 2015, by means of https://web.archive.org (Year: 2015).*
(Continued)

*Primary Examiner* — Vincent Wall
(74) *Attorney, Agent, or Firm* — Cantor Colburn LLP

(57) ABSTRACT

A method of manufacturing a metal oxide film includes injecting a reaction gas and metal precursors into a chamber, forming a first metal precursor film on a substrate in a plasma OFF state, forming a first sub-metal oxide film by oxidizing the first metal precursor film in a plasma ON state, and forming a second metal precursor film on the first sub-metal oxide film in the plasma OFF state, where the metal oxide film has an amorphous phase, a thickness of about 20 nanometer (nm) to about 130 nm, and a dielectric constant of about 10 to about 50.

11 Claims, 13 Drawing Sheets

(51) Int. Cl.
*H01L 49/02* (2006.01)
*H01L 51/52* (2006.01)
*H01L 27/12* (2006.01)

(52) U.S. Cl.
CPC .. *H01L 21/02186* (2013.01); *H01L 21/02189* (2013.01); *H01L 21/02205* (2013.01); *H01L 21/02244* (2013.01); *H01L 21/02274* (2013.01); *H01L 27/1214* (2013.01); *H01L 27/1225* (2013.01); *H01L 27/1248* (2013.01); *H01L 28/60* (2013.01); *H01L 51/5206* (2013.01); *H01L 21/02252* (2013.01); *H01L 27/1255* (2013.01); *H01L 2227/323* (2013.01); *H01L 2251/303* (2013.01)

(56) References Cited

U.S. PATENT DOCUMENTS

| | | | |
|---|---|---|---|
| 7,049,247 | B2 | 5/2006 | Gates et al. |
| 7,229,888 | B2 | 6/2007 | Kil et al. |
| 7,416,936 | B2 | 8/2008 | Kil et al. |
| 7,666,793 | B2 | 2/2010 | Wachi et al. |
| 7,897,966 | B2 | 3/2011 | Tran Quoc et al. |
| 7,923,385 | B2 | 4/2011 | Wu et al. |
| 8,025,932 | B2 | 9/2011 | Wolden et al. |
| 9,831,274 | B2 | 11/2017 | Takahashi et al. |
| 9,871,058 | B2 | 1/2018 | Takahashi et al. |
| 9,881,939 | B2 | 1/2018 | Takahashi et al. |
| 10,461,099 | B2 | 10/2019 | Takahashi et al. |
| 10,892,282 | B2 | 1/2021 | Takahashi et al. |
| 2005/0095850 | A1 | 5/2005 | Adachi et al. |
| 2006/0019033 | A1* | 1/2006 | Muthukrishnan ..... C23C 16/401 427/248.1 |
| 2006/0240679 | A1* | 10/2006 | Lee ..................... H01L 21/3141 438/785 |
| 2006/0267019 | A1 | 11/2006 | Kim et al. |
| 2007/0032013 | A1 | 2/2007 | Yoon et al. |
| 2009/0269941 | A1* | 10/2009 | Raisanen .......... C23C 16/45536 438/778 |
| 2011/0207283 | A1* | 8/2011 | Haukka ................. C23C 16/402 438/381 |
| 2012/0119327 | A1 | 5/2012 | Kwon et al. |
| 2013/0217203 | A1 | 8/2013 | Kwon et al. |
| 2020/0098563 | A1* | 3/2020 | Shoji ................ H01L 21/02186 |

FOREIGN PATENT DOCUMENTS

| | | |
|---|---|---|
| CN | 1873987 | 12/2006 |
| CN | 102034686 | 4/2011 |
| CN | 102543964 | 7/2012 |
| CN | 105870196 | 8/2016 |
| JP | 2003282722 | 10/2003 |
| JP | 2010192294 | 9/2010 |
| KR | 100644410 | 11/2006 |
| KR | 1020080092185 | 10/2008 |
| KR | 1020150039015 | 4/2015 |
| KR | 1020170089040 | 8/2017 |

OTHER PUBLICATIONS

Korean Office Action—Korean Application No. KR 10-2017-0133462 dated Oct. 18, 2021.
Chinese Office Action—Chinese Application No. 201811172480.4 dated Jan. 14, 2022, citing references listed within.

* cited by examiner

METHOD OF MANUFACTURING METAL OXIDE FILM AND DISPLAY DEVICE INCLUDING METAL OXIDE FILM

This application claims priority to Korean Patent Application No. 10-2017-0133462, filed on Oct. 13, 2017, and all the benefits accruing therefrom under 35 U.S.C. § 119, the content of which in its entirety is herein incorporated by reference.

BACKGROUND

1. Field

Exemplary embodiments of the invention relate to a method of manufacturing a metal oxide film and a display device including a metal oxide film.

2. Description of the Related Art

With a development of multimedia, display devices are becoming increasingly important. Accordingly, various types of the display devices such as a liquid crystal display and an organic light emitting display are being used.

Among these display devices, the liquid crystal display is one of the most widely used types of flat panel displays. The liquid crystal display generally includes a pair of substrates respectively having field generating electrodes, such as pixel electrodes and a common electrode, and a liquid crystal layer interposed between the pair of substrates. In the liquid crystal display, voltages are respectively applied to the field generating electrodes to generate an electric field in the liquid crystal layer. The electric field determines orientations of liquid crystal molecules in the liquid crystal layer and controls polarization of incident light. Accordingly, an image is displayed on the liquid crystal display.

In addition, the organic light emitting display displays images using an organic light emitting diode that generates light through recombination of electrons and holes. The organic light emitting display has various advantages such as fast response speed, high luminance, wide viewing angle, and low power consumption.

In order to manufacture such display devices, a chemical vapor deposition ("CVD") method is being widely used.

SUMMARY

Exemplary embodiments of the invention provide a method of manufacturing a high dielectric constant metal oxide film having a predetermined thickness or more.

Exemplary embodiments of the invention also provide a method of manufacturing an amorphous metal oxide film.

Exemplary embodiments of the invention also provide a display device including an amorphous metal oxide film having a high dielectric constant.

However, exemplary embodiments of the invention are not restricted to the one set forth herein. The above and other exemplary embodiments of the invention will become more apparent to one of ordinary skill in the art to which the invention pertains by referencing the detailed description of the invention given below.

According to an exemplary embodiment of the invention, there is provided a method of manufacturing a metal oxide film. The method includes injecting a reaction gas and metal precursors into a chamber, forming a first metal precursor film on a substrate in a plasma OFF state, forming a first sub-metal oxide film by oxidizing the first metal precursor film in a plasma ON state, and forming a second metal precursor film on the first sub-metal oxide film in the plasma OFF state, where the metal oxide film provided has an amorphous phase, a thickness of about 20 nanometers (nm) to about 130 nm, and a dielectric constant of about 10 to about 50.

In an exemplary embodiment, the metal precursors may include at least one of zirconium-based, hafnium-based, and titanium-based materials.

In an exemplary embodiment, the metal precursors may include at least one of $Zr(N(CH3)2(C2H5))3$, $Zr(N(CH3)C2H5)4$, $Zr(OC(CH3)3)4$, $Ti(N(CH3)2(C2H5))$, $Hf(N(CH3)3(C2H5))3$, $Hf(N(CH3)C2H5)4$, and $Hf(OC(CH3)3)4$.

In an exemplary embodiment, the metal oxide film may include at least one of zirconium oxide, hafnium oxide, and titanium oxide.

In an exemplary embodiment, the method may further include forming a second sub-metal oxide film by oxidizing the second metal precursor film in the plasma ON state.

In an exemplary embodiment, the forming the first sub-metal oxide film by oxidizing the first metal precursor film in the plasma ON state and the forming the second metal precursor film on the first sub-metal oxide film in the plasma OFF state may be performed one or more times.

In an exemplary embodiment, a pressure inside the chamber may be about 0.1 torr to about 10 torr.

In an exemplary embodiment, a temperature inside the chamber may be about 100 degrees Celsius (° C.) to about 400° C.

In an exemplary embodiment, the injecting the reaction gas and the metal precursors into the chamber may include injecting a carrier gas together with the metal precursors.

In an exemplary embodiment, a time interval of the plasma ON state and a time interval of the plasma OFF state may be equal.

In an exemplary embodiment, a ratio of a time interval of the plasma ON state and a time interval of the plasma OFF state may be one of 1:2, 1:3, 1:4, and 1:5.

According to another exemplary embodiment of the invention, there is provided a display device including a substrate, and a metal oxide film disposed on the substrate, where the metal oxide film has an amorphous phase, a thickness of about 20 nm to about 130 nm, and a dielectric constant of about 10 to about 50.

In an exemplary embodiment, the display device may further include a first electrode and a second electrode disposed with the metal oxide film interposed between the first electrode and the second electrode, where the first electrode, the second electrode, and the metal oxide film may constitute a capacitor.

In an exemplary embodiment, the thickness of the metal oxide film may be about 90 nm to about 130 nm.

In an exemplary embodiment, the display device may further include an insulating film disposed between the second electrode and the metal oxide film.

In an exemplary embodiment, the insulating film may include at least one of silicon oxide, silicon nitride, and silicon oxynitride.

In an exemplary embodiment, the thickness of the metal oxide film may be about 60 nm to about 80 nm.

In an exemplary embodiment, a thickness of the insulating film may be about 30 nm to about 50 nm.

In an exemplary embodiment, the metal oxide film may include at least one of zirconium oxide, hafnium oxide, and titanium oxide.

The display device may further include a transparent electrode disposed on the metal oxide film, an organic light emitting layer disposed on the transparent electrode, and a common electrode disposed on the organic light emitting layer.

BRIEF DESCRIPTION OF THE DRAWINGS

These and/or other exemplary embodiments will become apparent and more readily appreciated from the following description of the exemplary embodiments, taken in conjunction with the accompanying drawings, in which.

DETAILED DESCRIPTION

Figure 1:
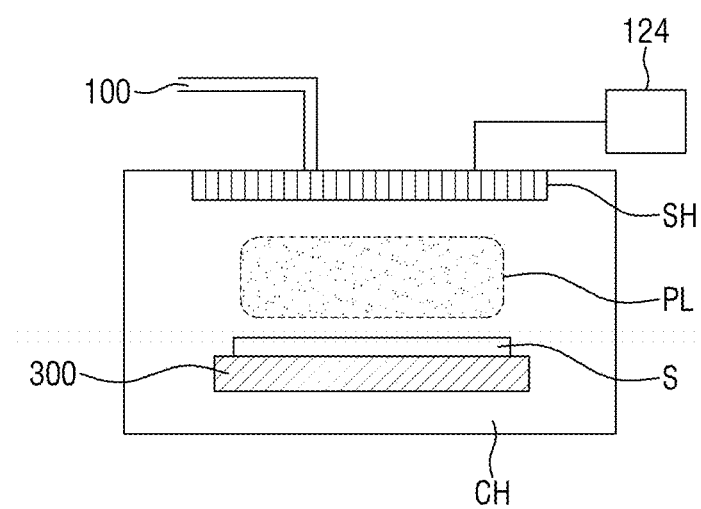
FIG. 1 is a conceptual diagram of an exemplary embodiment of an apparatus for manufacturing a metal oxide film, the apparatus designed to perform a method of manufacturing a metal oxide film.

The advantages and features of the invention and methods for achieving the advantages and features will be apparent by referring to the exemplary embodiments to be described in detail with reference to the accompanying drawings. However, the invention is not limited to the exemplary embodiments disclosed hereinafter, but can be implemented in diverse forms. The matters defined in the description, such as the detailed construction and elements, are nothing but specific details provided to assist those of ordinary skill in the art in a comprehensive understanding of the invention, and the invention is only defined within the scope of the appended claims.

Where an element is described as being related to another element such as being "on" another element or "located on" a different layer or a layer, includes both a case where an element is located directly on another element or a layer and a case where an element is located on another element via another layer or still another element. In contrast, where an element is described as being is related to another element such as being "directly on" another element or "located directly on" a different layer or a layer, indicates a case where an element is located on another element or a layer with no intervening element or layer therebetween. In the entire description of the invention, the same drawing reference numerals are used for the same elements across various drawing figures.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the drawing figures. It will be understood that relative terms are intended to encompass different orientations of the device in addition to the orientation depicted in the drawing figures. For example, if the device in one of the drawing figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the drawing figures are schematic in nature and their shapes are not intended to illustrate the precise shape of a region and are not intended to limit the scope of the claims.

Hereinafter, embodiments of the invention will be described with reference to the attached drawings.

FIG. 1 is a conceptual diagram of an apparatus for manufacturing a metal oxide film, the apparatus designed to perform a method of manufacturing a metal oxide film according to an exemplary embodiment.

Referring to FIG. 1, the apparatus for manufacturing a metal oxide film may include a chamber CH, a susceptor 300, a shower head SH, a power supply unit 124, an inlet 100, and an outlet (not shown).

The chamber CH may define an internal space desired for a process. A plurality of elements to be described later may be disposed in the internal space of the chamber CH. The chamber CH may be maintained at atmospheric pressure or in a vacuum depending on a process step. In addition, the internal space of the chamber CH may be connected to the outside air or may be sealed depending on a process step.

The susceptor 300 may be disposed in a lower part of the space inside the chamber CH. The susceptor 300 may support a substrate S to be processed.

In an exemplary embodiment, the substrate S may be an insulating substrate used in a display device.

Although not illustrated in the drawing, in an exemplary embodiment, the susceptor 300 may be connected to a driving unit for moving the substrate S up and down. Accordingly, the substrate S placed on the susceptor 300 may be moved up or down as needed in the space inside the chamber CH.

Although not illustrated in the drawing, the susceptor 300 may be connected to a temperature control unit for changing the temperature of the substrate S. Accordingly, the temperature of the substrate S may be adjusted according to process conditions.

The shower head SH may be placed to face the susceptor 300. The shower head SH may include a plurality of nozzles to evenly distribute a gas supplied through the inlet 100. That is, the gas supplied through the inlet 100 may be evenly distributed into the chamber CH via the shower head SH.

The shower head SH may be connected to the power supply unit 124. In an exemplary embodiment, the power supply unit 124 may supply radio frequency ("RF") power to the shower head SH, for example.

The susceptor 300 may be placed to face the shower head SH. As will be described in detail later, in an exemplary embodiment, the shower head SH may function as a top electrode, and the susceptor 300 may function as a bottom electrode. Thus, when electric power is supplied to the shower head SH, a plasma region PL may be provided between the shower head SH and the susceptor 300. In the plasma region PL, a reaction gas to be described later may be excited into a plasma state. This will be described in detail later.

A method of manufacturing a metal oxide film according to an exemplary embodiment will now be described with reference to FIGS. 2 through 5.

Figure 2:
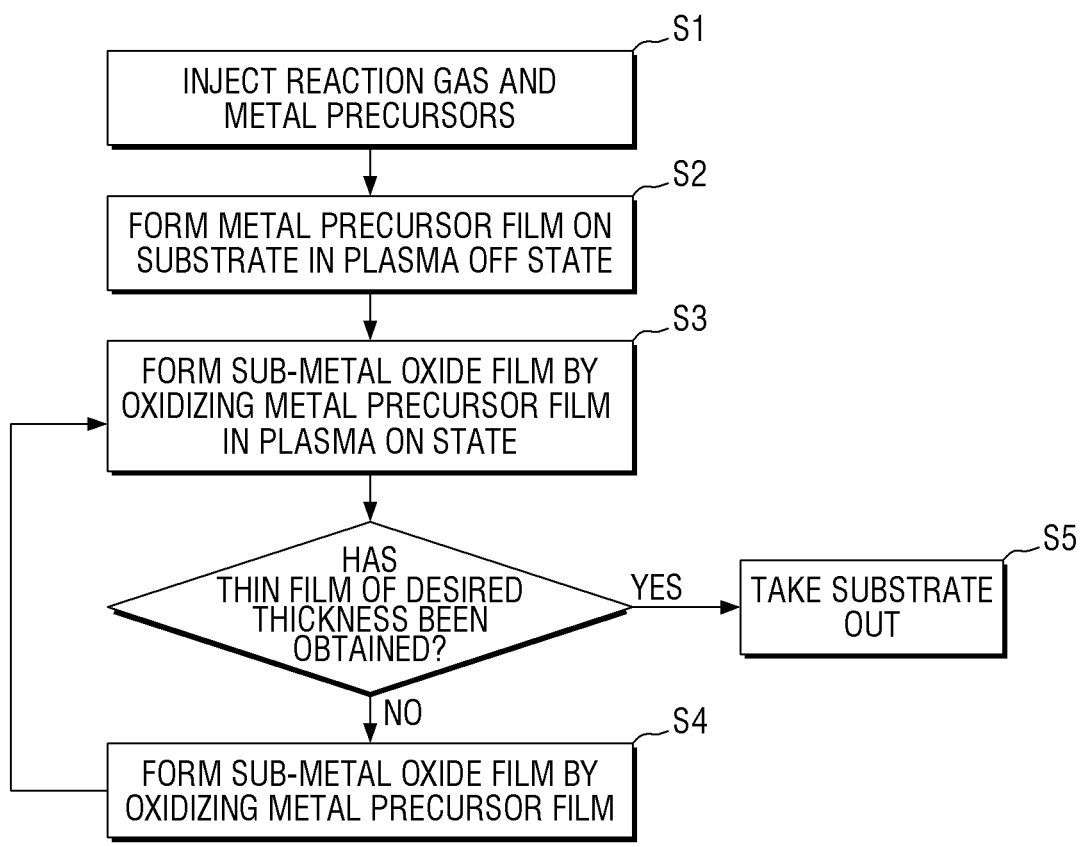
FIG. 2 is a flowchart illustrating an exemplary embodiment of a method of manufacturing a metal oxide film.
Figure 3:
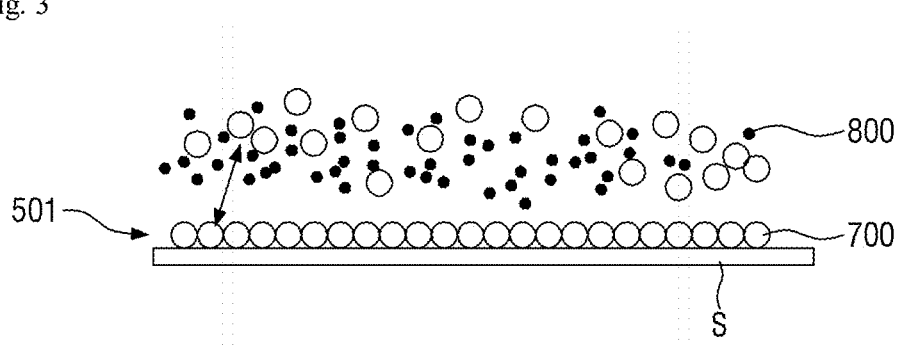
FIG. 3 is a cross-sectional view illustrating an exemplary embodiment of method of manufacturing a metal oxide film.
Figure 4:
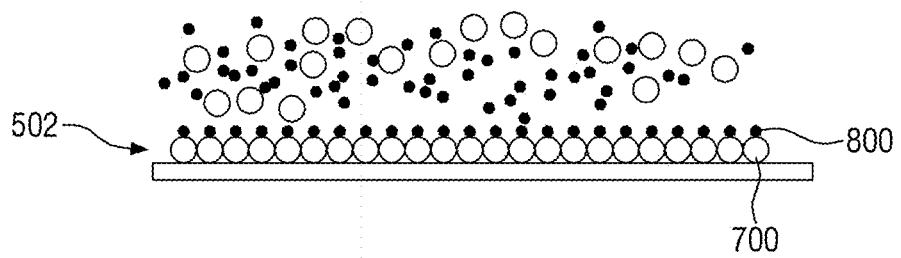
FIG. 4 is a cross-sectional view illustrating an exemplary embodiment of the method of manufacturing a metal oxide film.
Figure 5:
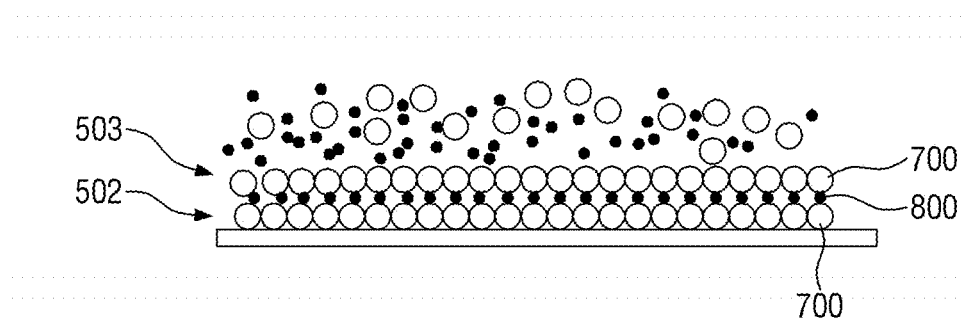
FIG. 5 is a cross-sectional view illustrating an exemplary embodiment of the method of manufacturing a metal oxide film.

FIG. 2 is a flowchart illustrating a method of manufacturing a metal oxide film according to an exemplary embodiment. FIGS. 3 through 5 are cross-sectional views illustrating the method of manufacturing a metal oxide film according to the exemplary embodiment.

Referring to FIG. 2 along with FIGS. 1 and 3 to 5, the method of manufacturing a metal oxide film according to the exemplary embodiment may include injecting a reaction gas and metal precursors into a chamber CH (operation S1), forming a first metal precursor film 501 on a substrate S (operation S2), forming a first sub-metal oxide film 502 by oxidizing the first metal precursor film 501 (operation S3), and forming a second metal precursor film 503 on the first sub-metal oxide film 502 (operation S4).

First, the injecting of the reaction gas and the metal precursors into the chamber CH may be performed. In an exemplary embodiment, the reaction gas and the metal precursors may be simultaneously provided into the chamber CH. In an exemplary embodiment, the reaction gas and the metal precursors may be sequentially provided into the chamber CH.

In an exemplary embodiment, the injecting of the reaction gas and the metal precursors may be continuous throughout the entire process. In other words, the reaction gas and the metal precursors may be continuously supplied during the process.

In an exemplary embodiment, the injecting of the reaction gas and the metal precursors may be discontinuous. In this case, the reaction gas and the metal precursors may be supplied into the chamber CH periodically or non-periodically.

In an exemplary embodiment, the reaction gas may be nitrous oxide (N2O) and/or oxygen (O2). In either case, the reaction gas may generate oxygen anions in the plasma state to be described below.

In an exemplary embodiment, the metal precursors may include at least one of zirconium (Zr)-based, hafnium (HF)-based, and titanium (Ti)-based materials, for example.

More specifically, the metal precursors may include at least one of Zr(N(CH3)2(C2H5))3, Zr(N(CH3)C2H5)4, Zr(OC(CH3)3)4, Ti(N(CH3)2(C2H5)), Hf(N(CH3)3(C2H5))3, Hf(N(CH3)C2H5))4, and Hf(OC(CH3)3)4, for example.

In an exemplary embodiment, a carrier gas may be further injected together with the reaction gas and the metal precursors.

The carrier gas may be a gas that moves the metal precursors without intervening in a reaction.

In an exemplary embodiment, the carrier gas may be an inert gas. In an exemplary embodiment, the carrier gas may be argon (Ar) gas, for example.

Next, referring to FIG. 3, the forming of the first metal precursor film 501 on the substrate S may be performed.

For ease of description, some terms will be defined. The term "plasma ON state," as used herein, refers to a state in which a plasma region PL is provided between a shower head SH and a susceptor 300 because electric power is supplied to the shower head SH. The term "plasma OFF state," as used herein, refers to a state in which the plasma region PL is not provided between the shower head SH and the susceptor 300 because no electric power is supplied to the shower head SH.

The forming the first metal precursor film 501 on the substrate S may be performed in the plasma OFF state. That is, in this state, the reaction gas 800 and the metal precursors may not react with each other.

In the plasma OFF state, a plurality of metal precursors 700 may be adsorbed on the substrate S. The metal precursors 700 may form the first metal precursor film 501 on the substrate S. In an exemplary embodiment, the provided first metal precursor film 501 may be a monolayer, for example.

Next, referring to FIG. 4, the forming of the first sub-metal oxide film 502 by oxidizing the first metal precursor film 501 (operation S3) may be performed.

The forming of the first sub-metal oxide film 502 by oxidizing the first metal precursor film 501 (operation S3) may be performed in the plasma ON state. In the plasma ON state, the reaction gas may become a plasma state. Accordingly, the reaction gas may generate oxygen anions.

Referring to FIG. 4, the reaction gas 800 in the plasma state may be bonded to the metal precursors 700 that form the first sub-metal oxide film 502. In other words, the first metal precursor film 501 (refer to FIG. 3) may be oxidized by the reaction gas 800. In an exemplary embodiment, since the metal precursors 700 are at least one of Zr-based, HF-based and Ti-based materials, the first sub-metal oxide film 502 thus provided may include at least one of zirconium oxide ($ZrO_2$), hafnium oxide ($HfO_2$), and titanium oxide ($TiO_2$), for example.

Next, referring to FIG. 5, the forming of the second metal precursor film 503 on the first sub-metal oxide film 502 (operation S4) may be performed. The forming of the second metal precursor film 503 on the first sub-metal oxide film 502 may be performed in the plasma OFF state.

A repulsive force between homogeneous particles is generated between the first metal precursor film 501 (refer to FIG. 3) before being oxidized and the metal precursors 700. Therefore, the metal precursors 700 are not adsorbed on the first metal precursor film 501. When the first metal precursor film 501 is oxidized to the first sub-metal oxide film 502, the repulsive force between the first sub-metal oxide film 502 and the metal precursors 700 is weakened. Therefore, the metal precursors 700 may be adsorbed on the first sub-metal oxide film 502. Accordingly, the second metal precursor film 503 including the metal precursors 700 may be disposed on the first sub-metal oxide film 502. Like the first metal precursor film 501 described above, the second metal precursor film 503 may be a monolayer.

The method of manufacturing a high dielectric constant (k) metal oxide film according to the exemplary embodiment may further include forming a second sub-metal oxide film by oxidizing the second metal precursor film 503.

Specifically, in the plasma ON state after the formation of the second metal precursor film 503, the reaction gas 800 in the plasma state may be bonded to the second metal precursor film 503 to form the second sub-metal oxide film. The second sub-metal oxide film may be substantially the same as the first sub-metal oxide film 502.

The above process may be repeatedly performed one or more times until a film of a desired thickness is obtained.

After a thin film is grown to a desired thickness, the substrate S may be taken out of the chamber CH (operation S5).

The method of manufacturing a metal oxide film according to the exemplary embodiment may be performed under the condition that the plasma ON state and the plasma OFF state are repeated periodically or non-periodically.

Figure 6:
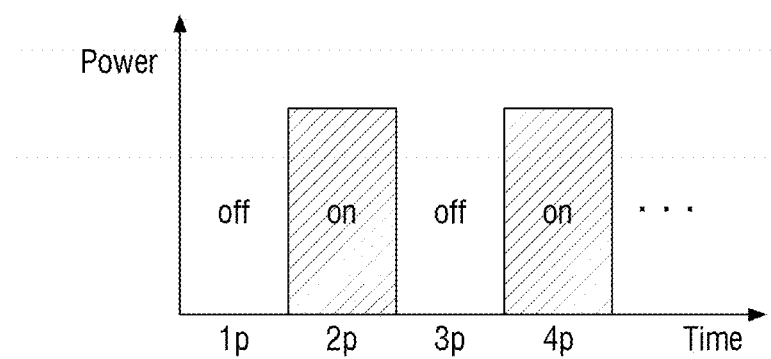
FIG. 6 is a graph illustrating an exemplary embodiment of the method of manufacturing a metal oxide film.

FIG. 6 is a graph illustrating the method of manufacturing a metal oxide film according to the exemplary embodiment.

In an exemplary embodiment, the method of manufacturing a metal oxide film may start in the plasma OFF state.

Referring to FIG. 6 along with FIGS. 1 to 5, first, a first period 1p which is the plasma OFF state may proceed. The forming of the first metal precursor film 501 on the substrate S (operation S2) may be performed in the first period 1p.

Then, a second period 2p which is the plasma ON state may proceed. The forming of the first sub-metal oxide film 502 by oxidizing the first metal precursor film 501 may be performed in the second period 2p.

Then, a third period 3p which is the plasma OFF state may proceed. The forming of the second metal precursor film 503 on the first sub-metal oxide film 502 (operation S4) may be performed in the third period 3p.

Then, a fourth period 4p which is the plasma ON state may proceed. In the fourth period 4p, the second metal precursor film 503 disposed on the first sub-metal oxide film 502 may be oxidized to a second sub-metal oxide film (not illustrated).

The above process may be generalized as follows. The method of manufacturing a high-k metal oxide film according to the exemplary embodiment may include the plasma ON state of an $n^{th}$ period and the plasma OFF state of an $(n+1)^{th}$ period.

In addition, the $n^{th}$ period and the $(n+1)^{th}$ period may alternate with each other.

In an exemplary embodiment, the time interval of the $n^{th}$ period may be about 0.1 seconds to about 10 seconds, so that the metal precursors may be sufficiently adsorbed.

In FIG. 6, the intervals of the $n^{th}$ period and the $(n+1)^{th}$ period are equal to each other. However, embodiments are not limited to this case. That is, in an exemplary embodiment, a ratio of the time intervals of the $n^{th}$ period and the $(n+1)^{th}$ period may be one of 1:2, 1:3, 1:4, and 1:5, for example.

In an exemplary embodiment, the time intervals of the $n^{th}$ period and the $(n+1)^{th}$ period may be irregular. That is, the time intervals of the $n^{th}$ period and the $(n+1)^{th}$ period may be changed depending on the condition or purpose of the process.

The method of manufacturing a metal oxide film according to the exemplary embodiment may be terminated after the plasma ON state. That is, the last deposited film may be a metal oxide film including oxidized metal precursors.

A conventional atomic layer deposition ("ALD") method includes a purging time. Thus, a lot of time is desired to form a thin film having a large area with a thickness equal to or greater than about 20 nanometers (nm), for example. The method of manufacturing a high-k metal oxide film according to the exemplary embodiment may omit the purging process by simultaneously supplying the reaction gas and the metal precursors. Thus, a thin film having a thickness equal to or greater than about 20 nm may be provided within a short time.

In addition, the resultant structure of the manufacturing method may have the following characteristics.

In an exemplary embodiment, the thickness of a metal oxide film provided as a result of the above manufacturing method may be about 20 nm to about 130 nm, for example.

The metal oxide film provided as a result of the manufacturing method may have high permittivity. In an exemplary embodiment, the metal oxide film may have a dielectric constant (k) of about 10 to about 50, for example.

Since the broken bond charge of oxygen anions generated by the reaction gas is discontinuous, the resultant structure grown by the above process may have an amorphous phase. This will now be described in detail with reference to FIGS. 7(a), 7(b) and 8.

Figure 7A:
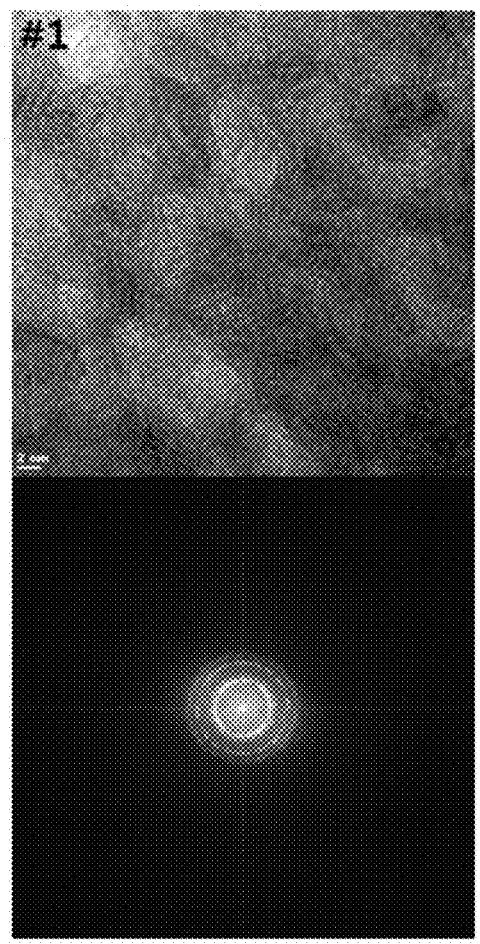
FIGS. 7(a) and 7(b) show an exemplary embodiment of transmission electron microscope ("TEM") photographs of the resultant structure of the method of manufacturing a metal oxide film and a conventional structure of a conventional method of manufacturing a metal oxide film.
Figure 7B:
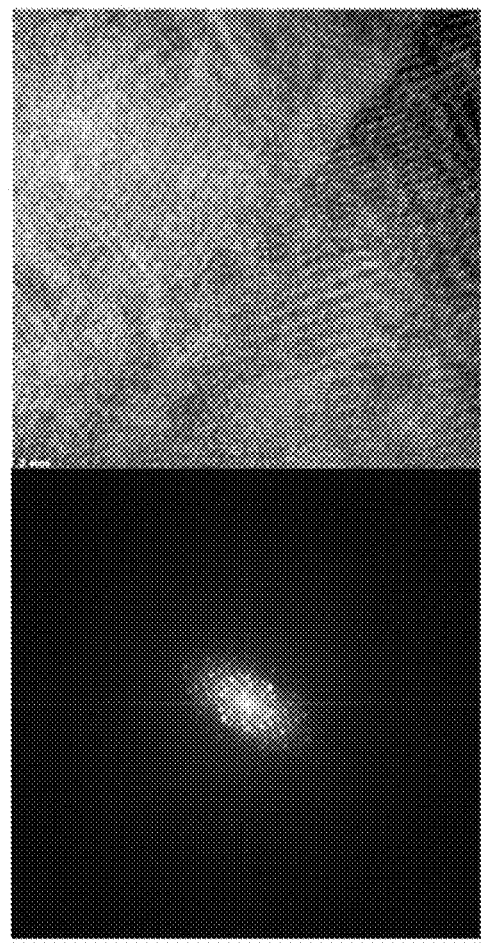

FIGS. 7(a) and 7(b) show transmission electron microscope ("TEM") photographs of the resultant structure of the method of manufacturing a metal oxide film according to the exemplary embodiment and a conventional structure of a conventional method of manufacturing a metal oxide film.

FIG. 7(a) shows a diffraction pattern of the resultant structure according to an exemplary embodiment, and FIG. 7(b) shows a diffraction pattern of a thin film provided using a conventional ALD method.

Referring to FIG. 7(a), the diffraction pattern has a ring shape. This phenomenon occurs when particles of a thin film scatter light in all directions, that is, when the particles are amorphous. This shows that the resultant structure of the exemplary embodiment has an amorphous phase.

Referring to FIG. 7(b), the diffraction pattern includes a plurality of dots. This phenomenon occurs when particles of a thin film scatter light in a specific direction, that is, when the particles are crystalline. With the conventional ALD method, a crystalline metal oxide film is provided.

Figure 8:
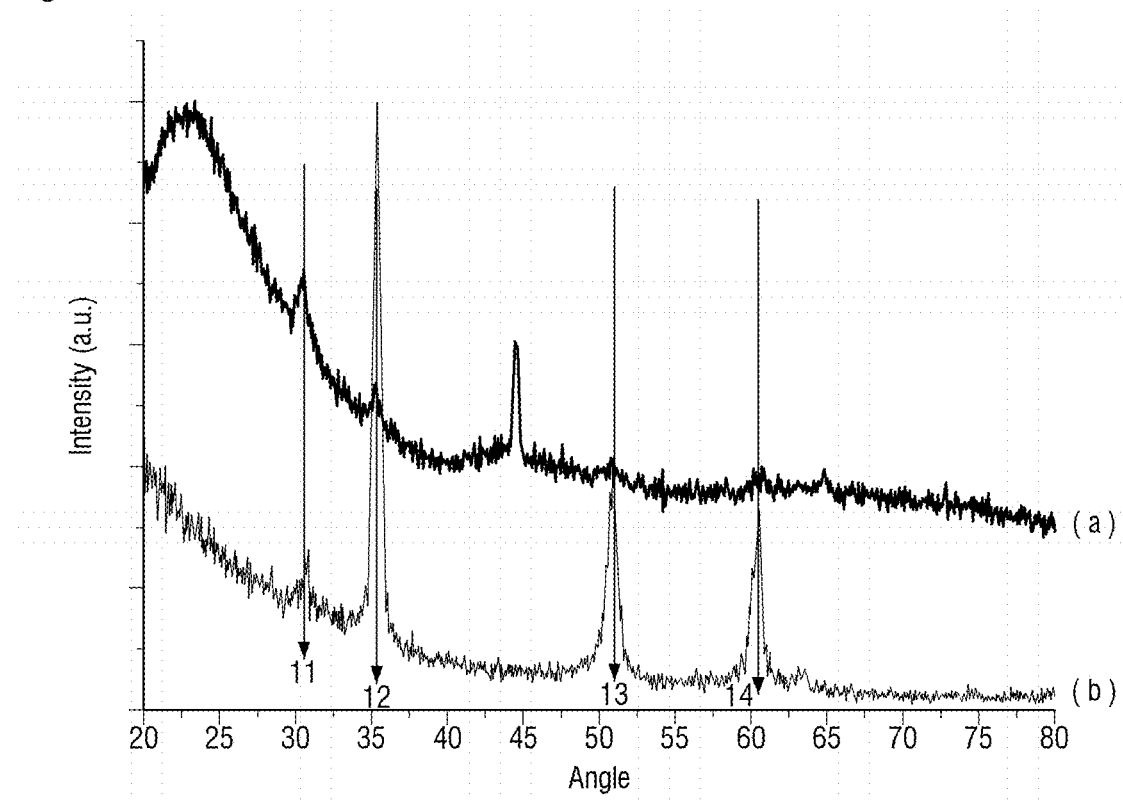
FIG. 8 illustrates the results of X-ray diffraction ("XRD") analysis of the resultant structure of the exemplary embodiment and a thin film provided using an atomic layer deposition ("ALD") method.

FIG. 8 is a graph comparing the resultant structures of the method of manufacturing a high-k metal oxide film according to the exemplary embodiment and the conventional ALD method.

FIG. 8 illustrates the results of X-ray diffraction ("XRD") analysis of the resultant structure of the exemplary embodiment and a thin film provided using the ALD method.

Here, graph (a) represents the resultant structure of the exemplary embodiment, and graph (b) represents the thin film provided using the conventional method.

When a thin film having a crystal structure is subjected to XRD analysis, at least one peak is observed.

Referring to the analysis result of graph (a), a peak which is a proof of the crystal structure is not detected. That is, it may be seen that the resultant structure of the exemplary embodiment has an amorphous structure.

Graph (b) includes one or more peaks 11, 12, 13 and 14. That is, it may be seen that the metal oxide film provided using the conventional ALD method has a crystalline structure.

The method of manufacturing a high-k metal oxide film according to the exemplary embodiment may be performed under the following process conditions.

In an exemplary embodiment, the chamber CH may be maintained in a vacuum, and the pressure of the chamber CH may be adjusted between about 0.1 torr and about 10 torr, for example.

In an exemplary embodiment, the temperature inside the chamber CH may be adjusted between about 100 degrees Celsius (° C.) and about 400° C., for example.

A display device including a metal oxide film according to an exemplary embodiment will now be described. The display device including the metal oxide film according to the exemplary embodiment may be manufactured using the method of manufacturing a metal oxide film according to the above-described embodiment.

Figure 9:
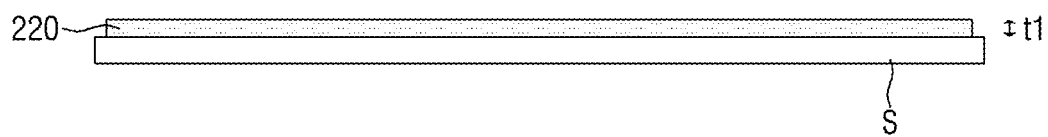
FIG. 9 is a cross-sectional view of an exemplary embodiment of a display device.

FIG. 9 is a cross-sectional view of a display device according to an exemplary embodiment.

Referring to FIG. 9, the display device according to the exemplary embodiment includes a substrate S and a metal oxide film 220 disposed on the substrate S.

In an exemplary embodiment, the metal oxide film 220 may be a thin film provided using the method of manufacturing a metal oxide film according to the exemplary embodiment.

In an exemplary embodiment, the metal oxide film 220 may have a first thickness t1. In an exemplary embodiment, the first thickness t1 may be about 20 nm to about 130 nm, for example.

In an exemplary embodiment, the metal oxide film 220 may have an amorphous phase over the entire area.

In an exemplary embodiment, the metal oxide film 220 may be a high-k metal oxide film. Thus, the dielectric constant (k) of the metal oxide film 220 may be about 10 to about 50.

Figure 10:
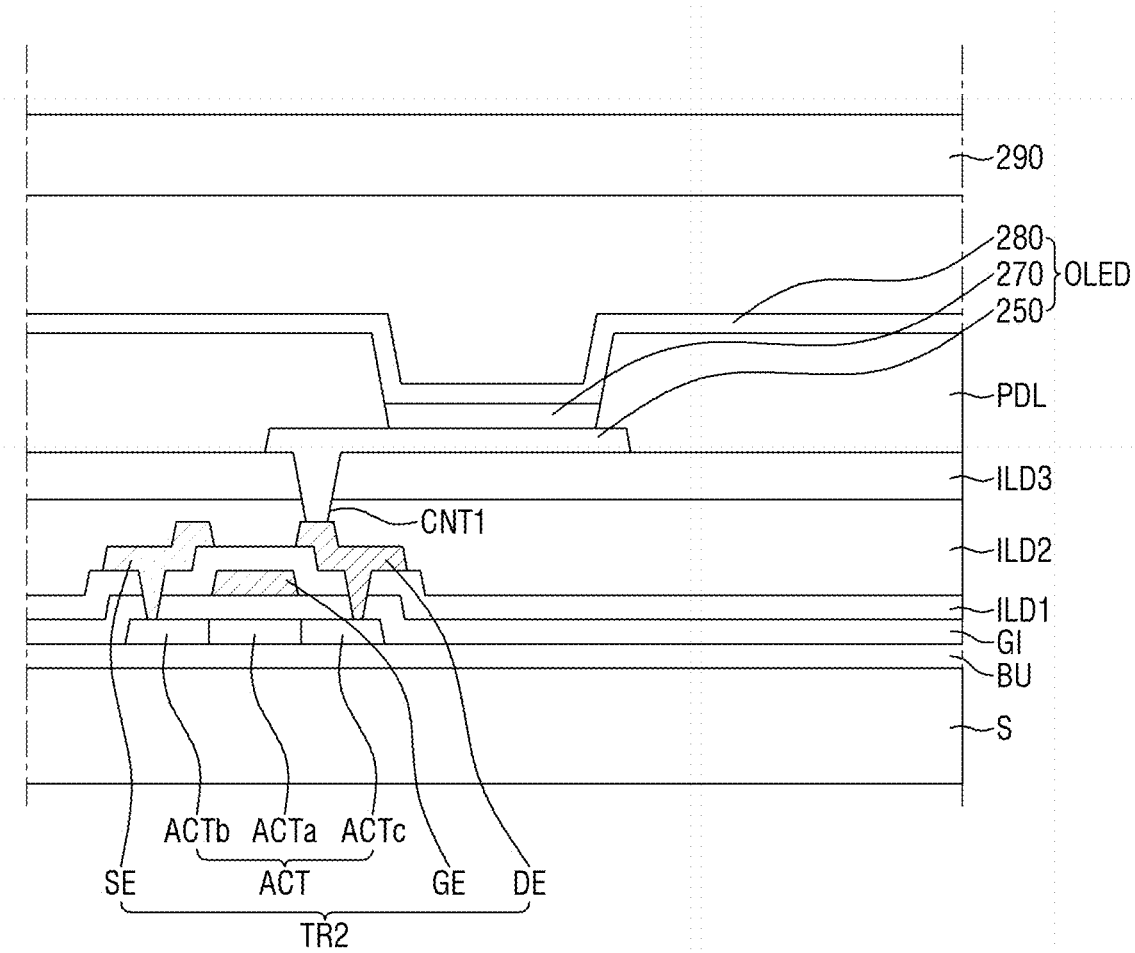
FIG. 10 is a cross-sectional view of an exemplary embodiment of a display device.
Figure 11:
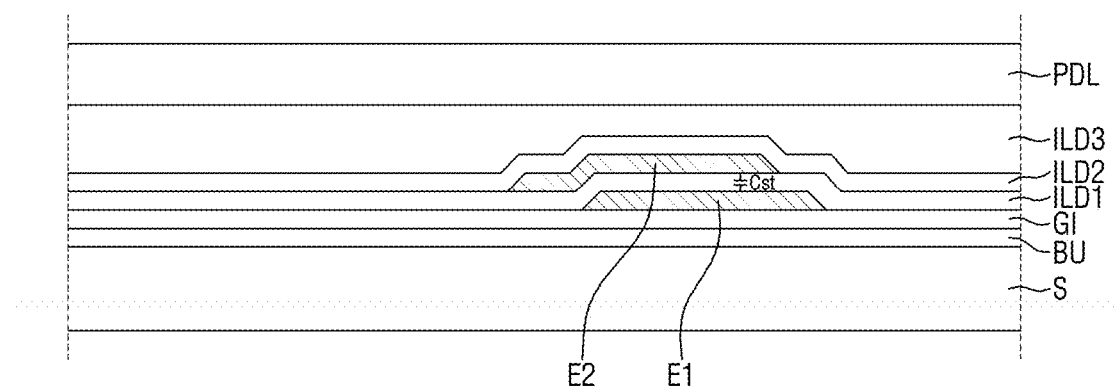
FIG. 11 is a cross-sectional view of the display device according to the exemplary embodiment of FIG. 10.

FIGS. 10 and 11 are cross-sectional views of a display device according to an exemplary embodiment.

Referring to FIGS. 10 and 11, the display device according to the exemplary embodiment may include at least one capacitor Cst including a first electrode E1, a second electrode E2, and a metal oxide film (not illustrated) disposed between the first electrode E1 and the second electrode E2. In an exemplary embodiment, the capacitor Cst included in the display device may be a storage capacitor.

In an exemplary embodiment, the display device may be an organic light emitting display.

In this case, a buffer layer BU may be disposed on a substrate S. The buffer layer BU may prevent the penetration of moisture and oxygen from the outside through the substrate S. In addition, the buffer layer BU may planarize the surface of the substrate S. In an exemplary embodiment, the buffer layer BU may include at least one of a silicon nitride (SiNx) film, a silicon oxide ($SiO_2$) film, and a silicon oxynitride (SiOxNy) film, for example. In another exemplary embodiment, the buffer layer BU may be omitted depending on the type of the substrate S or process conditions.

A semiconductor layer including a semiconductor pattern ACT may be disposed on the buffer layer BU. The semiconductor layer will be described based on the semiconductor pattern ACT. In an exemplary embodiment, the semiconductor pattern ACT may include a combination of at least one of polycrystalline silicon, monocrystalline silicon, low temperature polycrystalline silicon, amorphous silicon, and an oxide semiconductor, for example. The semiconductor pattern ACT may include, in an exemplary embodiment, a channel region not doped with an impurity and source and drain regions ACTb and ACTc doped with an impurity. The source region ACTb is located on a side of the channel region ACTa and is electrically connected to a source electrode SE to be described later. The drain region ACTc is located on the other side of the channel region ACTa and is electrically connected to a drain electrode DE to be described later.

A gate insulating film GI may be disposed on the semiconductor layer including the semiconductor pattern ACT. The gate insulating film GI may be a gate insulating layer in an exemplary embodiment. In an exemplary embodiment, the gate insulating film GI may include any at least one of inorganic insulating materials such as silicon oxide (SiOx) and silicon nitride (SiNx) and organic insulating materials such as benzocyclobutene ("BCB"), acrylic materials and polyimide, for example.

A gate conductor including a gate electrode GE may be disposed on the gate insulating film GI. The gate electrode GE may extend from a scan line (not illustrated) and overlap the semiconductor pattern ACT. In an exemplary embodiment, the gate conductor may include at least one of aluminum (Al)-based metal including aluminum alloys, silver (Ag)-based metal including silver alloys, copper (Cu)-based metal including copper alloys, molybdenum (Mo)-based metal including molybdenum alloys, chromium (Cr), titanium (Ti), and tantalum (Ta), for example.

A first insulating film ILD1 may be disposed on the gate conductor including the gate electrode GE. The first insulating film ILD1 may be a high-k metal oxide film. That is, the first insulating film ILD1 may have an amorphous phase, and the dielectric constant (k) of the first insulating film ILD1 may be about 10 to about 50, for example. In an exemplary embodiment, the thickness of the first insulating film ILD1 may be about 20 nm to about 130 nm, for example.

In an exemplary embodiment, the first insulating film ILD1 may include at least one of zirconium oxide (ZrO2), hafnium oxide (HfO2), and titanium oxide (TiO2), for example.

A data conductor including the source electrode SE and the drain electrode DE may be disposed on the first insulating film ILD1. The data conductor may include the source electrode SE and the drain electrode DE. The source electrode SE and the drain electrode DE are disposed on the first insulating film ILD1 to be spaced apart from each other. The data conductor may include at least one of a metal, an alloy, a metal nitride, a conductive metal oxide, and a transparent conductive material. In an exemplary embodiment, the data conductor may have a monolayer structure or a multilayer structure including at least one of nickel (Ni), cobalt (Co), titanium (Ti), silver (Ag), copper (Cu), molybdenum (Mo), aluminum (Al), beryllium (Be), niobium (Nb), gold (Au), iron (Fe), selenium (Se), and tantalum (Ta). In an exemplary embodiment, the source electrode SE and the drain electrode DE may include an alloy of at least one of the above metals and at least one of titanium (Ti), zirconium (Zr), tungsten (W), tantalum (Ta), niobium (Nb), platinum (Pt), hafnium (Hf), oxygen (O) and nitrogen (N), for example.

The semiconductor pattern ACT, the gate electrode GE, the source electrode SE and the drain electrode DE described above constitute a second switching element TR2. In FIG. 10, the second switching element TR2 is illustrated as a top gate type. However, the second switching element TR2 is not limited to the top gate type. That is, in another exemplary embodiment, the second switching element TR2 may be provided as a bottom gate type.

A second insulating film ILD2 may be disposed on the data conductor. The second insulating film ILD2 may remove steps, thereby increasing the luminous efficiency of a pixel electrode 250 and an organic light emitting layer 270 which will be described later. The second insulating film ILD2 may include an organic material in an exemplary embodiment. In an exemplary embodiment, the second insulating film ILD2 may include at least one of polyimide, polyacryl, and polysiloxane, for example. In an exemplary embodiment, the second insulating film ILD2 may include an inorganic material or a composite of an inorganic material and an organic material. A third insulating film ILD3 may be disposed on the second insulating film ILD2. A first contact hole CNT1 may be defined in the second insulating film ILD2 to expose at least a part of the drain electrode DE.

The pixel electrode 250 may be disposed on the second insulating film ILD2. The pixel electrode 250 may be electrically connected to the drain electrode DE exposed by the first contact hole CNT1. That is, the pixel electrode 250 may be an anode which is a hole injection electrode. When provided as an anode, the pixel electrode 250 may include a material having a high work function in order to facilitate hole injection. In addition, the pixel electrode 250 may be a reflective electrode, a transflective electrode, or a transmissive electrode. The pixel electrode 250 may include a reflective material in an exemplary embodiment. In an exemplary embodiment, the reflective material may include at least one of silver (Ag), magnesium (Mg), chromium (Cr), gold (Au), platinum (Pt), nickel (Ni), copper (Cu), tungsten (W), aluminum (Al), aluminum-lithium (Al—Li), magnesium-indium (Mg—In), and magnesium-silver (Mg—Ag), for example.

The pixel electrode 250 may be provided as a monolayer in an exemplary embodiment. In an alternative exemplary embodiment, the pixel electrode 250 may be provided as a multilayer in which two or more materials are stacked.

When provided as a multilayer, the pixel electrode 250 may include, in an exemplary embodiment, a reflective film and a transparent or translucent electrode disposed on the reflective film. In an exemplary embodiment, the pixel electrode 250 may include a reflective film and a transparent or translucent electrode disposed under the reflective film. In an exemplary embodiment, the pixel electrode 250 may have a three-layer structure of ITO/Ag/ITO, for example.

Here, the transparent or translucent electrode may include at least one of indium tin oxide ("ITO"), indium zinc oxide ("IZO"), zinc oxide (ZnO), indium oxide (In2O3), indium gallium oxide ("IGO") and aluminum zinc oxide ("AZO"), for example.

A pixel defining layer PDL may be disposed on the pixel electrode 250. An opening that at least partially exposes the pixel electrode 250 is defined in the pixel defining layer PDL. The pixel defining layer PDL may include an organic material or an inorganic material. In an exemplary embodiment, the pixel defining layer PDL may include a material such as photoresist, polyimide resin, acrylic resin, a silicon compound, or polyacrylic resin, for example.

The organic light emitting layer 270 may be disposed on the pixel electrode 250 and the pixel defining layer PDL. More specifically, the organic light emitting layer 270 may be disposed on an area of the pixel electrode 250 which is exposed through the opening of the pixel defining layer PDL. In an exemplary embodiment, the organic light emitting layer 270 may at least partially cover sidewalls of the pixel defining layer PDL.

In an exemplary embodiment, the organic light emitting layer 270 may emit light of one of red, blue and green colors, for example. In an exemplary embodiment, the organic light emitting layer 270 may emit white light or emit light of one of cyan, magenta and yellow colors, for example. When the organic light emitting layer 270 emits white light, it may include a white light emitting material or may have a stack of a red light emitting layer, a green fight emitting layer and a blue light emitting layer.

A common electrode 280 may be disposed on the organic light emitting layer 270 and the pixel defining layer PDL. In an exemplary embodiment, the common electrode 280 may be disposed on the entire surface of the organic light emitting layer 270 and the pixel defining layer 260. The common electrode 280 may be a cathode in an exemplary embodiment. In an exemplary embodiment, the common electrode 280 may include at least one of Li. Ca, Lif/Ca, LiF/Al, Al, Ag, and Mg, for example. In addition, the common electrode 280 may include a material having a low work function. The common electrode 280 may be, in an exemplary embodiment, a transparent or translucent electrode including at least one of ITO, IZO, zinc oxide (ZnO), indium oxide (In2O3), IGO, and AZO, for example.

The pixel electrode 250, the organic light emitting layer 270 and the common electrode 280 described above may constitute an organic light emitting diode OLED. However, the organic light emitting diode OLED is not limited to this configuration and may be a multilayer structure further including a hole injection layer ("HIL"), a hole transport layer ("HTL"), an electron transport layer ("ETL"), and an electron injection layer ("EIL").

A counter substrate 290 may be placed to face the substrate S. The counter substrate 290 may be bonded to the substrate S by a sealing member. The counter substrate 290 may be a transparent insulating substrate in an exemplary embodiment. When the counter substrate 290 is a transparent insulating substrate, the transparent insulating substrate may be a glass substrate, a quartz substrate, a transparent resin substrate, or the like, for example.

In an exemplary embodiment, an encapsulation film (not illustrated), instead of the counter substrate 290, may be disposed on the common electrode 280. The encapsulation film may include at least one inorganic film and/or at least one organic film.

Referring to FIG. 11, the first electrode E1 and the second electrode E2 may be disposed with the first insulating film ILD1 interposed between them.

In an exemplary embodiment, the first electrode E1, the second electrode E2, and the first insulating layer ILD1 may constitute the storage capacitor Cst. That is, the first insulating film ILD1 may be a dielectric of the storage capacitor Cst.

In an exemplary embodiment, the first electrode E1 may be disposed in the same layer as the gate electrode GE, and the second electrode E2 may be disposed in the same layer as the source electrode SE or the drain electrode DE. When elements are "disposed in the same layer," it may mean that the elements are formed simultaneously in the same process and thus including the same material.

In an exemplary embodiment, the thickness of the first insulating film ILD1 may be about 100 nm to about 110 nm, for example.

A metal oxide film according to embodiments has a very small leakage current. Therefore, the metal oxide film may be used to realize a capacitor having excellent electrical characteristics.

Figure 12:
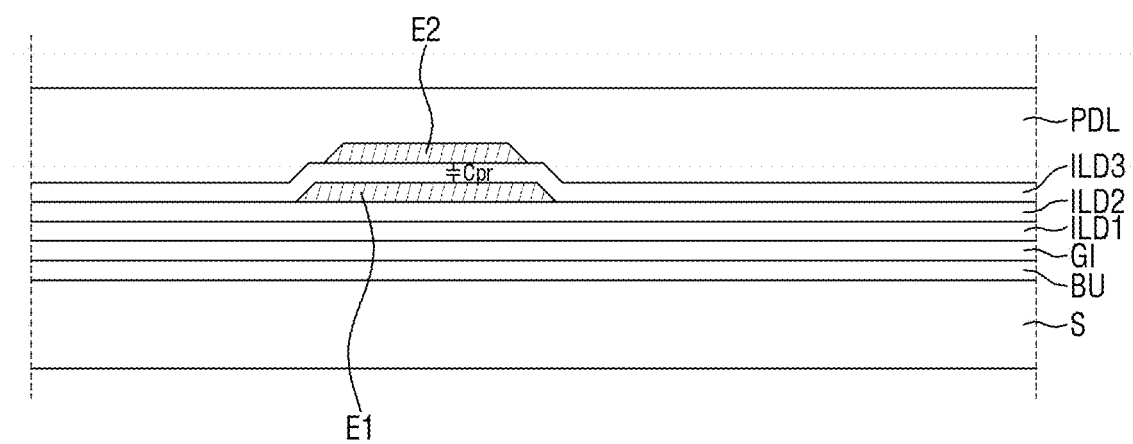
FIG. 12 is a cross-sectional view of an exemplary embodiment a display device.

FIG. 12 is a cross-sectional view of a display device according to an exemplary embodiment.

FIG. 12 is different from FIG. 11 in that a first electrode E1 and the second electrode E2 are disposed with a third insulating film ILD3 interposed between them.

In an exemplary embodiment, the first electrode E1, the second electrode E2, and the third insulating film ILD3 may constitute a program capacitor Cpr. That is, the third insulating film ILD3 may be a dielectric of the program capacitor Cpr.

In this case, the third insulating film ILD3 may be a high-k metal oxide film. That is, the third insulating film ILD3 may have an amorphous phase and may have a dielectric constant (k) of about 10 to about 50, for example. In an exemplary embodiment, the thickness of the third insulating film ILD3 may be about 90 nm to about 130 nm, for example.

In an exemplary embodiment, the third insulating film ILD3 may include at least one of zirconium oxide (ZrO2), hafnium oxide (HfO2), and titanium oxide (TiO2), for example.

Figure 13:
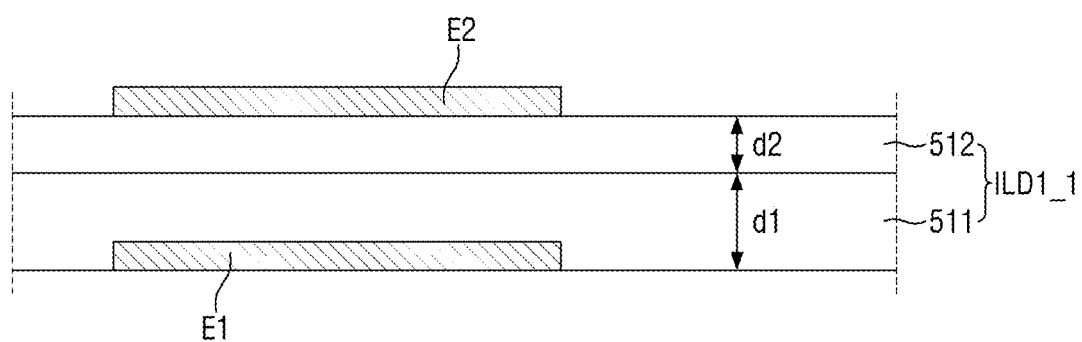
FIG. 13 is a partial cross-sectional view of an exemplary embodiment of a display device.

FIG. 13 is a partial cross-sectional view of a display device according to an exemplary embodiment.

Referring to FIG. 13, a first insulating layer ILD1_1 may be a laminate of a first sub-film 511 and a second sub-film 512.

In an exemplary embodiment, the first sub-film 511 may be a metal oxide film. In this case, the first sub-film 511 may have an amorphous phase. In an exemplary embodiment, the dielectric constant (k) of the first sub-film 511 may be about 10 to about 50, for example.

In an exemplary embodiment, the first sub-film 511 may include at least one of zirconium oxide (ZrO2), hafnium oxide (HfO2), and titanium oxide (TiO2), for example.

In an exemplary embodiment, the thickness d1 of the first sub-film 511 may be about 60 nm to about 80 nm, for example.

The second sub-film 512 may be disposed on the first sub-film 511. In an exemplary embodiment, the second sub-film 512 may include at least one of a silicon nitride (SiNx) film, a silicon oxide ($SiO_2$) film, and a silicon oxynitride (SiOxNy) film, for example.

In an exemplary embodiment, the thickness d2 of the second sub-film 512 may be about 30 nm to about 50 nm, for example.

As described above, the first insulating film ILD1_1 may be a dielectric of a capacitor. When the dielectric of the capacitor is a laminate of a metal oxide film and a silicon-including insulating film, its electrical characteristics may be stably maintained.

In FIG. 13, the first insulating film ILD1_1 includes the first sub-film 511 and the second sub-film 512. However, embodiments are not limited to this case.

In an exemplary embodiment, the third insulating film ILD3 of FIG. 12 may have the structure described in FIG. 13.

According to embodiments, the resistance of a display device may be measured in real time during a process.

However, the effects of the exemplary embodiments are not restricted to the one set forth herein. The above and other effects of the exemplary embodiments will become more apparent to one of daily skill in the art to which the exemplary embodiments pertain by referencing the claims.

While the invention has been particularly illustrated and described with reference to exemplary embodiments thereof, it will be understood by those of ordinary skill in the art that various changes in form and detail may be made therein without departing from the spirit and scope of the invention as defined by the following claims. The exemplary embodiments should be considered in a descriptive sense only and not for purposes of limitation.

What is claimed is:

1. A method of manufacturing a metal oxide film, the method comprising:
    simultaneously injecting a reaction gas and metal precursors into a chamber;
    forming a first metal precursor film on a substrate in a plasma OFF state;
    forming a first sub-metal oxide film by oxidizing the first metal precursor film in a plasma ON state; and
    forming a second metal precursor film on the first sub-metal oxide film in the plasma OFF state,
    wherein the metal oxide film has an amorphous phase, a thickness of about 20 nanometers to about 130 nanometers, and a dielectric constant of about 10 to about 50, and
    wherein the forming the first sub-metal oxide film by oxidizing the first metal precursor film in the plasma ON state includes supplying electric power to a shower head such that a plasma region is provided between the shower head and a susceptor in the plasma ON state, and wherein the reaction gas and the metal precursors are continuously injected into the chamber during an entirety of the forming the first metal precursor film, an entirety of the forming the first sub-metal oxide film and an entirety of the forming the second metal precursor film.

2. The method of claim 1, wherein the metal precursors comprise at least one of zirconium-based, hafnium-based, and titanium-based materials.

3. The method of claim 2, wherein the metal precursors comprise at least one of $Zr(N(CH_3)_2(C_2H_5))_3$, $Zr(N(CH_3)C_2H_5)_4$, $Zr(OC(CH_3)_3)_4$, $Ti(N(CH_3)_2(C_2H_5))$, $Hf(N(CH_3)_3(C_2H_5))_3$, $Hf(N(CH_3)C_2H_5)_4$, and $Hf(OC(CH_3)_3)_4$.

4. The method of claim 2, wherein the metal oxide film comprises at least one of zirconium oxide, hafnium oxide, and titanium oxide.

5. The method of claim 1, further comprising forming a second sub-metal oxide film by oxidizing the second metal precursor film in the plasma ON state.

6. The method of claim 1, wherein the forming the first sub-metal oxide film by oxidizing the first metal precursor film in the plasma ON state and the forming the second metal precursor film on the first sub-metal oxide film in the plasma OFF state are performed one or more times.

7. The method of claim 1, wherein a pressure inside the chamber is about 0.1 torr to about 10 torr.

8. The method of claim 1, wherein a temperature inside the chamber is about 100 degrees Celsius to about 400 degrees Celsius.

9. The method of claim 1, wherein the injecting the reaction gas and the metal precursors into the chamber comprises injecting a carrier gas together with the metal precursors.

10. The method of claim 1, wherein a time interval of the plasma ON state and a time interval of the plasma OFF state are equal.

11. The method of claim 1, wherein a ratio of a time interval of the plasma ON state and a time interval of the plasma OFF state is one of 1:2, 1:3, 1:4, and 1:5.

* * * * *

UNITED STATES PATENT AND TRADEMARK OFFICE
CERTIFICATE OF CORRECTION

PATENT NO. : 11,362,162 B2
APPLICATION NO. : 16/132031
DATED : June 14, 2022
INVENTOR(S) : Myung Soo Huh et al.

It is certified that error appears in the above-identified patent and that said Letters Patent is hereby corrected as shown below:

On the Title Page

Delete "Sung Chui" the 3rd inventor given name represented in item (72) and insert --Sung Chul--

Signed and Sealed this
Thirtieth Day of August, 2022

Katherine Kelly Vidal
*Director of the United States Patent and Trademark Office*